(12) United States Patent
Goto et al.

(10) Patent No.: US 12,490,469 B2
(45) Date of Patent: Dec. 2, 2025

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Ken-Ichi Goto, Hsinchu (TW); Cheng-Yi Wu, Taichung (TW)

(73) Assignee: Taiwan Semiconductor Manufacuturing Company, Ltd., Hsinchu (TW)

( * ) Notice: Subject to any disclaimer, the term of this patent is extended or adjusted under 35 U.S.C. 154(b) by 317 days.

(21) Appl. No.: 18/164,600

(22) Filed: Feb. 5, 2023

(65) Prior Publication Data

US 2024/0136441 A1 Apr. 25, 2024

Related U.S. Application Data

(60) Provisional application No. 63/419,307, filed on Oct. 25, 2022.

(51) Int. Cl.
*H10D 30/67* (2025.01)
*H01L 21/02* (2006.01)
(Continued)

(52) U.S. Cl.
CPC ... *H10D 30/6741* (2025.01); *H01L 21/02488* (2013.01); *H01L 21/02491* (2013.01); *H01L 21/02502* (2013.01); *H01L 21/02516* (2013.01); *H01L 21/02521* (2013.01); *H01L 21/02532* (2013.01); *H01L 21/02565* (2013.01); *H01L 21/02598* (2013.01); *H01L 21/02609* (2013.01); *H10D 30/031* (2025.01); *H10D 30/6739* (2025.01); *H10D 30/675* (2025.01); *H10D 30/6755* (2025.01); *H10D 62/405* (2025.01); *H10D 86/423* (2025.01);
(Continued)

(58) Field of Classification Search
CPC ............. H10D 30/6741; H10D 62/405; H10D 30/675; H10D 30/6739; H10D 87/00; H10D 99/00; H10D 86/431; H10D 86/60; H10D 86/425; H10D 30/6755; H10D 30/031; H10D 86/423; H01L 21/02488; H01L 21/02491; H01L 21/02502; H01L 21/02516; H01L 21/02521; H01L 21/02532; H01L 21/02565; H01L 21/02598; H01L 21/02609
See application file for complete search history.

(56) References Cited

U.S. PATENT DOCUMENTS 6,664,147 B2 * 12/2003 Voutsas .............. H10D 30/0314
438/149
2020/0135930 A1 * 4/2020 Passlack ............ H10D 30/6757

* cited by examiner

*Primary Examiner* — Richard A Booth
(74) *Attorney, Agent, or Firm* — JCIPRNET

(57) ABSTRACT

A semiconductor device includes a substrate, and a first transistor disposed on the substrate. The first transistor includes a first channel layer, a magnesium oxide layer, a first gate electrode, a first gate dielectric and first source/drain electrodes. A crystal orientation of the first channel layer is <100> or <110>. The magnesium oxide layer is located below the first channel layer and in contact with the first channel layer. The first gate electrode is located over the first channel layer. The first gate dielectric is located in between the first channel layer and the first gate electrode. The first source/drain electrodes are disposed on the first channel layer.

20 Claims, 20 Drawing Sheets

(51) Int. Cl.
*H10D 30/01* (2025.01)
*H10D 62/40* (2025.01)
*H10D 62/84* (2025.01)
*H10D 86/40* (2025.01)
*H10D 86/60* (2025.01)
*H10D 87/00* (2025.01)
*H10D 99/00* (2025.01)

(52) U.S. Cl.
CPC ......... *H10D 86/425* (2025.01); *H10D 86/431* (2025.01); *H10D 86/60* (2025.01); *H10D 87/00* (2025.01); *H10D 99/00* (2025.01); *H10D 62/84* (2025.01)

SEMICONDUCTOR DEVICE AND METHOD OF FABRICATING THE SAME

CROSS-REFERENCE TO RELATED APPLICATION

This application claims the priority benefit of U.S. provisional application Ser. No. 63/419,307, filed on Oct. 25, 2022. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
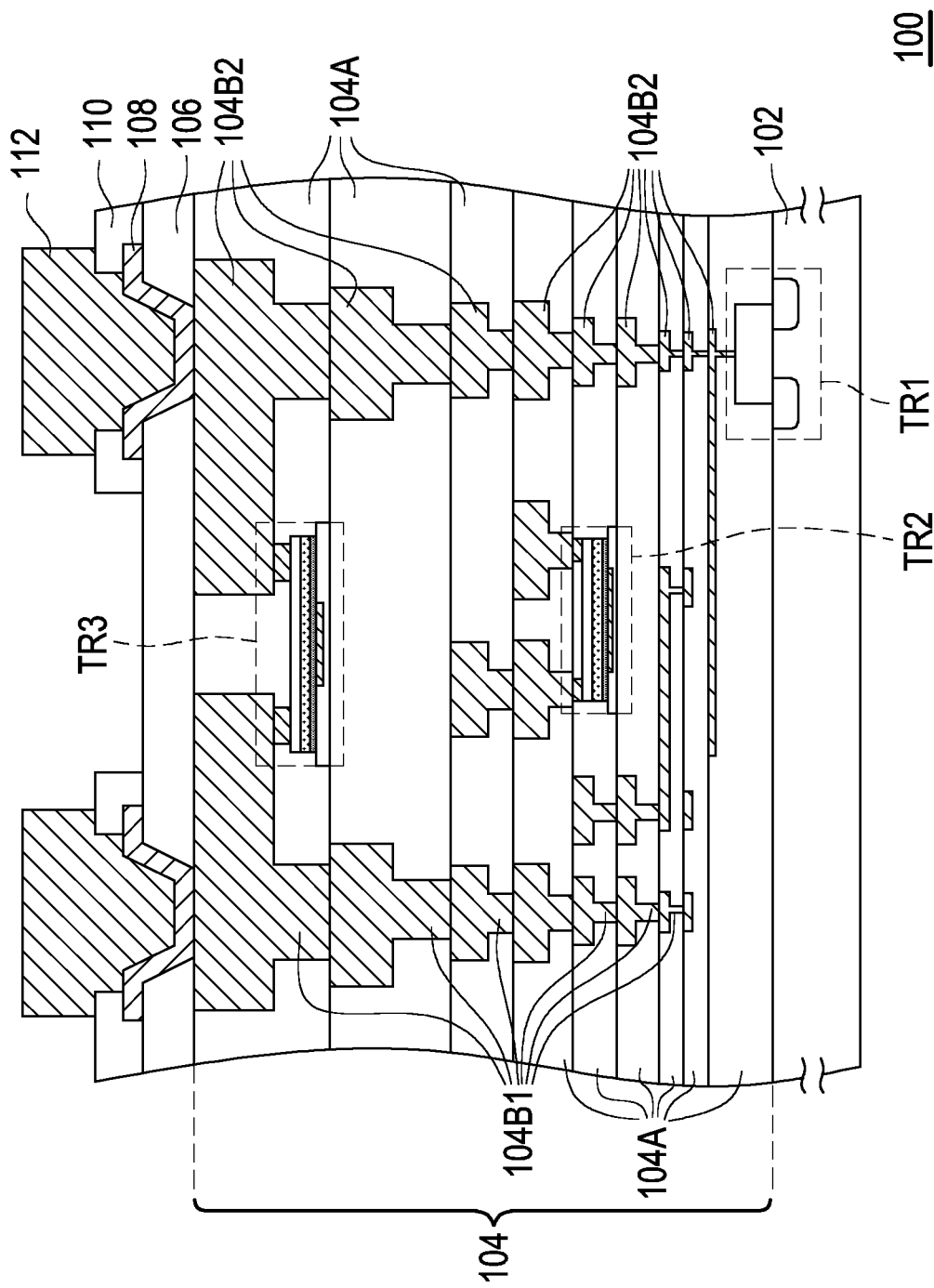
FIG. 1 is a schematic cross-sectional view of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The design of back-end transistors has great importance for chip area reduction. Conventional back-end transistors are mostly n-type transistors, which includes indium-gallium-zinc-oxide (IGZO) as the channel material. However, p-type transistors are rarely observed at the back-end. Although tin oxide (SnO) and copper oxide ($Cu_2O$) have been reported as p-type channel materials, however, they are known to be metastable and may cause reliability issues. In some embodiments of the present disclosure, a semiconductor device includes p-type transistors located at the back-end, whereby the p-type transistors are more stable and has improved reliability.

FIG. 1 is a schematic cross-sectional view of a semiconductor device in accordance with some embodiments of the disclosure. In some embodiments, the semiconductor device 100 includes a substrate 102, an interconnection structure 104, a passivation layer 106, a post-passivation layer 110, a plurality of conductive pads 108, and a plurality of conductive terminals 112. In some embodiments, the substrate 102 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 102 may be a bulk silicon substrate, a silicon-on-insulator (SOI) substrate, or a germanium-on-insulator (GOI) substrate.

In some embodiments, the substrate 102 includes various doped regions depending on circuit requirements (e.g., p-type semiconductor substrate or n-type semiconductor substrate). In some embodiments, the doped regions are doped with p-type dopants or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a transistor TR1, which is formed over the substrate 102. Depending on the types of the dopants in the doped regions, the transistor TR1 may be referred to as n-type transistor or p-type transistor. In some embodiments, the transistor TR1 further includes a metal gate and a channel under the metal gate. The channel is located between the source region and the drain region to serve as a path for electron to travel when the transistor TR1 is turned on. On the other hand, the metal gate is located above the substrate 102 and is embedded in the interconnection structure 104. In some embodiments, the transistor TR1 is formed using suitable Front-end-of-line (FEOL) process. For simplicity, one transistor TR1 is shown in FIG. 1. However, it should be understood that more than one transistor TR1 may be presented depending on the application of the semiconductor device 100. When multiple transistors TR1 are presented, these transistors TR1 may be separated by shallow trench isolation (STI; not shown) located between two adjacent transistors TR1.

As illustrated in FIG. 1, the interconnection structure 104 is formed over the substrate 102. In some embodiments, the interconnection structure 104 includes a plurality of dielectric layers 104A and a plurality of conductive layers (104B1, 104B2) alternately stacked up along a build-up direction. The interconnection structure 104 further includes transistors TR2 and transistors TR3 located in between the plurality of dielectric layers 104A. Although one transistor TR2 and one transistor TR3 are illustrated in FIG. 1, it should be noted that a plurality of the transistors TR2 and a plurality of the transistors TR3 will exist in the semiconductor device 100 in reality. In some embodiments, the transistors TR2 and the transistors TR3 are back-end-of-line (BEOL) transistors. In some embodiments, the transistors TR2 are n-type transistors, while the transistors TR3 are p-type transistors. In certain embodiments, an amount of the n-type transistors (transistors TR2) located in the interconnection structure 104 is greater than an amount of the p-type transistors (transistors TR3) located in the interconnection structure 104.

In some embodiments, the conductive layers (104B1, 104B2) include conductive vias 104B1 and conductive patterns 104B2 embedded in the dielectric layers 104A. In some embodiments, the conductive patterns 104B2 located at different level heights are connected to one another through the conductive vias 104B1. In other words, the conductive patterns 104B2 are electrically connected to one another through the conductive vias 104B1. In some embodiments, the bottommost conductive vias 104B1 are connected to the transistor TR1. For example, the bottommost conductive vias 104B1 are connected to the metal gate, which is embedded in the bottommost dielectric layer 104A, of the transistor TR1. In other words, the bottommost conductive vias 104B1 establish electrical connection between the transistor TR1 and the conductive patterns 104B2 of the interconnection structure 104. As illustrated in FIG. 1, the bottommost conductive via 104B1 is connected to the metal gate of the transistor TR1. It should be noted that in some alternative cross-sectional views, other bottommost conductive vias 104B1 are also connected to source/drain regions of the transistor TR1. That is, in some embodiments, the bottommost conductive vias 104B1 may be referred to as "contact structures" of the transistor TR1.

In some embodiments, the dielectric layers 104A include materials such as polyimide, epoxy resin, acrylic resin, phenol resin, benzocyclobutene (BCB), polybenzooxazole (PBO), or any other suitable polymer-based dielectric material. Alternatively, the dielectric layers 104A may be formed of oxides or nitrides, such as silicon oxide, silicon nitride, or the like. The dielectric layers 104A may be formed by suitable fabrication techniques such as spin-on coating, chemical vapor deposition (CVD), plasma-enhanced chemical vapor deposition (PECVD), or the like.

In some embodiments, the conductive layers (104B1, 104B2) include materials such as aluminum, titanium, copper, nickel, tungsten, or alloys thereof. The conductive layers (104B1, 104B2) may be formed by electroplating, deposition, and/or photolithography and etching. In some embodiments, the conductive patterns 104B2 and the underlying conductive vias 104B1 of the conductive layers are formed simultaneously. It should be noted that the number of the dielectric layers 104A, the number of the conductive layers (104B1, 104B2) illustrated in FIG. 1 are merely for illustrative purposes, and the disclosure is not limited thereto. In some alternative embodiments, fewer or more layers of the dielectric layers 104A and the conductive layers (104B1, 104B2) may be formed depending on the circuit design.

As illustrated in FIG. 1, the transistors TR2 and transistors TR3 are embedded in the interconnection structure 104. For example, each of the transistors TR2, TR3 may be embedded in one or more of the dielectric layers 104A. In some embodiments, the transistors TR2, TR3 are electrically connected to the conductive patterns 104B2 through the corresponding conductive vias 104B1. In some embodiments, the transistors TR2, TR3 may be arranged in an array (e.g. array of transistors/array of memory cells) in each of the dielectric layers 104A. The formation method and the structure of the transistors TR2, TR3 will be described in detail later.

As illustrated in FIG. 1, the passivation layer 106, the conductive pads 108, the post-passivation layer 110, and the conductive terminals 112 are sequentially formed on the interconnection structure 104. In some embodiments, the passivation layer 106 is disposed on the topmost dielectric layer 104A and the topmost conductive layer (conductive pattern 104B2). In some embodiments, the passivation layer 106 has a plurality of openings partially exposing the topmost conductive patterns 104B2. In some embodiments, the passivation layer 106 is a silicon oxide layer, a silicon nitride layer, a silicon oxy-nitride layer, or a dielectric layer formed by other suitable dielectric materials. The passivation layer 106 may be formed by suitable fabrication techniques such as (high-density plasma chemical vapor deposition) HDP-CVD, PECVD, or the like.

In some embodiments, the conductive pads 108 are formed over the passivation layer 106. In some embodiments, the conductive pads 108 extend into the openings of the passivation layer 106 to be in direct contact with the topmost conductive patterns 104B2. That is, the conductive pads 108 are physically and electrically connected to the interconnection structure 104. In some embodiments, the conductive pads 108 include aluminum pads, titanium pads, copper pads, nickel pads, tungsten pads, or other suitable metal pads. The conductive pads 108 may be formed by, for example, electroplating, deposition, and/or photolithography and etching. It should be noted that the number and the shape of the conductive pads 108 illustrated in FIG. 1 are merely for illustrative purposes, and the disclosure is not limited thereto. In some alternative embodiments, the number and the shape of the conductive pads 108 may be adjusted based on demand.

In some embodiments, the post-passivation layer 110 is formed over the passivation layer 106 and the conductive pads 108. In some embodiments, the post-passivation layer 110 is formed on the conductive pads 108 to protect the conductive pads 108. In some embodiments, the post-passivation layer 110 has a plurality of contact openings partially exposing each conductive pad 108. The post-passivation layer 110 may be a polyimide layer, a PBO layer, or a dielectric layer formed by other suitable polymers. In some embodiments, the post-passivation layer 110 is formed by suitable fabrication techniques such as HDP-CVD, PECVD, or the like.

As further illustrated in FIG. 1, the conductive terminals 112 are formed over the post-passivation layer 110 and the conductive pads 108. In some embodiments, the conductive terminals 112 extend into the contact openings of the post-passivation layer 110 to be in direct contact with the corresponding conductive pad 108. That is, the conductive terminals 112 are electrically connected to the interconnection structure 104 through the conductive pads 108. In some embodiments, the conductive terminals 112 are conductive pillars, conductive posts, conductive balls, conductive bumps, or the like. In some embodiments, a material of the conductive terminals 112 includes a variety of metals, metal alloys, or metals and mixture of other materials. For example, the conductive terminals 112 may be made of aluminum, titanium, copper, nickel, tungsten, tin, and/or alloys thereof. The conductive terminals 112 are formed by, for example, deposition, electroplating, screen printing, or other suitable methods. In some embodiments, the conductive terminals 112 are used to establish electrical connection with other components (not shown) subsequently formed or provided. Up to here, a semiconductor device 100 in accordance with some embodiments of the present disclosure is accomplished.

As illustrated in FIG. 1, a plurality of transistors TR3 (p-type transistors) are embedded in the interconnection structure 104 in between the dielectric layers 104A. The formation method and the structure of the transistors TR3 will be described in more detail by referring to FIG. 2A to FIG. 2H shown below.

Figure 2A:
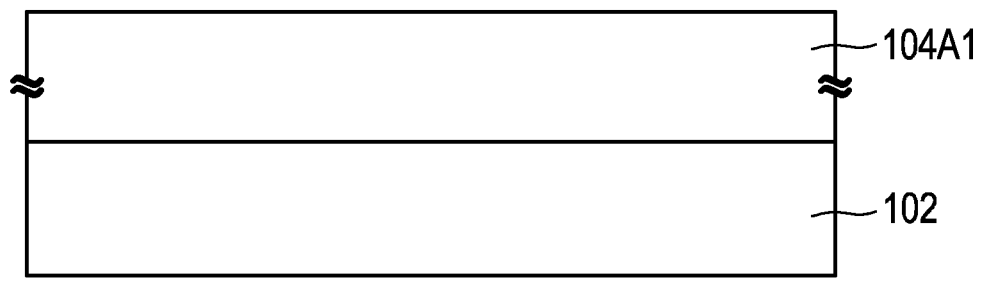
FIG. 2A to FIG. 2H are schematic cross-sectional views illustrating various stages in a method of fabricating a transistor as shown in FIG. 1 according to some embodiments of the disclosure.

FIG. 2A to FIG. 2H are schematic cross-sectional views illustrating various stages in a method of fabricating a transistor TR3 as shown in FIG. 1 according to some embodiments of the disclosure. Referring to FIG. 2A, a dielectric layer 104A1 is formed over the substrate 102 of the semiconductor structure 100. In some embodiments, the dielectric layer 104A1 may correspond to the dielectric layers 104A located at any level of the interconnection layer 104 shown in FIG. 1. In other words, the dielectric layer 104A1 may be directly contacting the substrate 102, or may be separated from the substrate 102 by a plurality of the dielectric layers 104A. In some embodiments, the dielectric layer 104A1 may be formed of the same material, and formed by the same method as with the dielectric layer 104A described above, thus its details will be omitted herein.

Figure 2B:
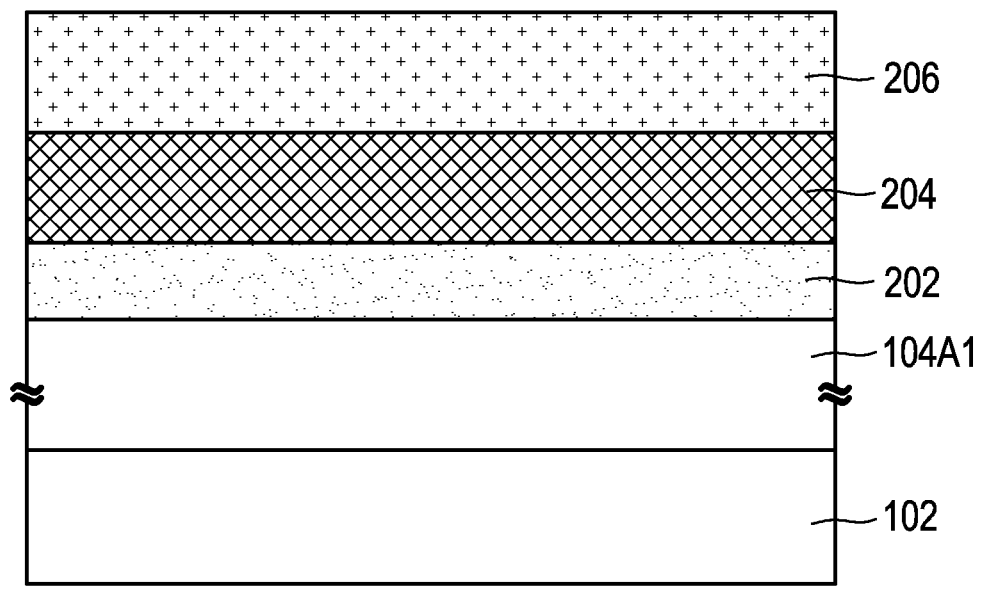

Referring to FIG. 2B, in a subsequent step, a bottom metal layer 202, a magnesium oxide (MgO) layer 204 and a channel layer 206 are sequentially formed over the dielectric layer 104A1. The bottom metal layer 202 is formed to be in direct contact with the dielectric layer 104A1, the magnesium oxide layer 204 is formed to be in direct contact with the bottom metal layer 202, and the channel layer 206 is formed to be in direct contact with the magnesium oxide layer 204. In some embodiments, the bottom metal layer 202 and the magnesium oxide layer 204 are formed by physical vapor deposition (PVD). Furthermore, the channel layer 206 may be formed by PVD, CVD, atomic layer deposition (ALD), or formed by a solution process, or the like. In some embodiments, a thickness of the bottom metal layer 202 is in a range of 2 nm to 20 nm, a thickness of the magnesium oxide layer 204 is in a range of 1 nm to 20 nm, and a thickness of the channel layer 206 is in a range of 2 nm to 30 nm.

In some embodiments, the bottom metal layer 202 is selected from a material that helps improve the crystallinity of the magnesium oxide layer 204 formed thereon. For example, the bottom metal layer 202 includes a material selected from the group consisting of iron (Fe), cobalt-iron-boron (CoFeB) and nickel-chromium (NiCr). In some embodiments, the channel layer 206 includes a material selected from the group consisting of germanium (Ge), nickel oxide (NiO), and tellurium (Te). In some alternative embodiments, the channel layer 206 may include tin oxide (SnO) or copper oxide ($Cu_2O$). In certain embodiments, the channel layer 206 is a single crystal germanium (Ge) layer.

In the exemplary embodiment, the channel layer 206 formed on the magnesium oxide layer 204 is a crystalline layer, and has a crystal orientation of <100> or <110>. Furthermore, a crystal orientation of the magnesium oxide layer 204 is the same as the crystal orientation of the channel layer 206. In one exemplary embodiment, the bottom metal layer 202 is iron (Fe) and the channel layer 206 is germanium (Ge), and a crystal orientation of the iron (Fe) layer, a crystal orientation of the magnesium oxide layer 204, and a crystal orientation of the germanium (Ge) layer are all <100>.

Figure 2C:
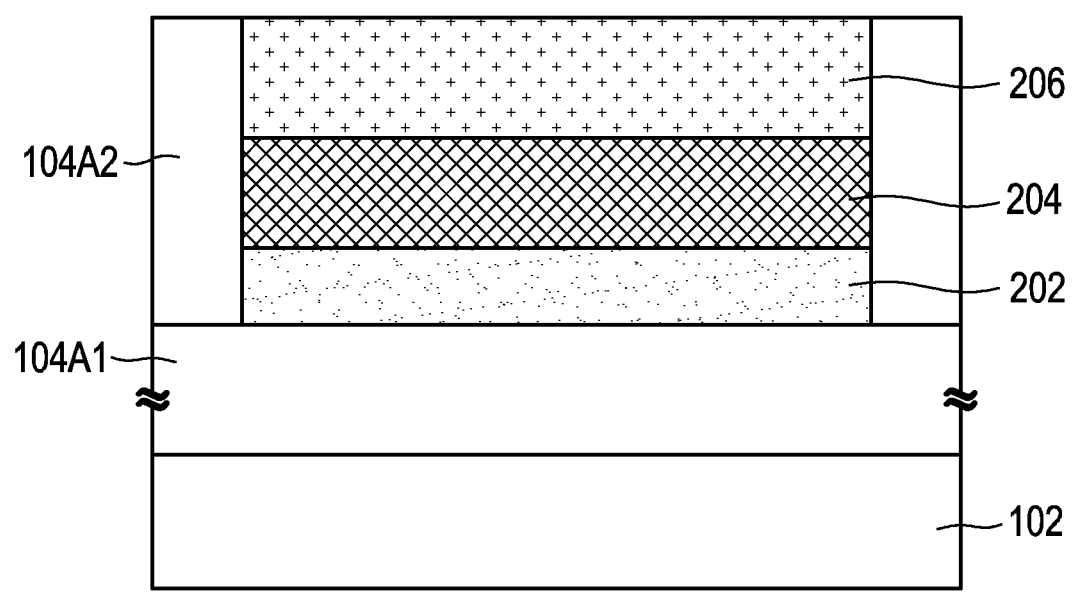

Referring to FIG. 2C, after forming the channel layer 206, portions of the channel layer 206, portions of the magnesium oxide layer 204 and portions of the bottom metal layer 202 are removed. For example, a photoresist (not shown) may be formed over the channel layer 206, and portions of the channel layer 206, the magnesium oxide layer 204 and the bottom metal layer 202 not covered by the photoresist may be removed. The photoresist may be a positive resist material or a negative resist material, that is suitable for a patterning process such as a photolithography process with a mask or a mask-less photolithography process (for instance, an electron-beam (e-beam) writing or an ion-beam writing).

After providing the photoresist, the channel layer 206, the magnesium oxide layer 204 and the bottom metal layer 202 are patterned together. For example, as illustrated in FIG. 2C, after the patterning process, sidewalls of the channel layer 206, sidewalls of the magnesium oxide layer 204, and sidewalls of the bottom metal layer 202 are aligned with one another. Thereafter, the photoresist is removed, and a dielectric layer 104A2 is formed to surround and cover sidewalls of the channel layer 206, the magnesium oxide layer 204 and the bottom metal layer 202. In some embodiments, the dielectric layer 104A2 may correspond to one of the dielectric layers 104A of the interconnection layer 104 shown in FIG. 1, thus its details will not be repeated herein. In some embodiments, the dielectric layer 104A2 is disposed on and contacting the dielectric layer 104A1. In some embodiments, after forming the dielectric layer 104A2, a planarization process (e.g., a chemical-mechanical planarization (CMP) process) is performed to remove excessive dielectric material. After the planarization process, a top surface of the dielectric layer 104A2 may be aligned with a top surface of the channel layer 206.

Figure 2D:
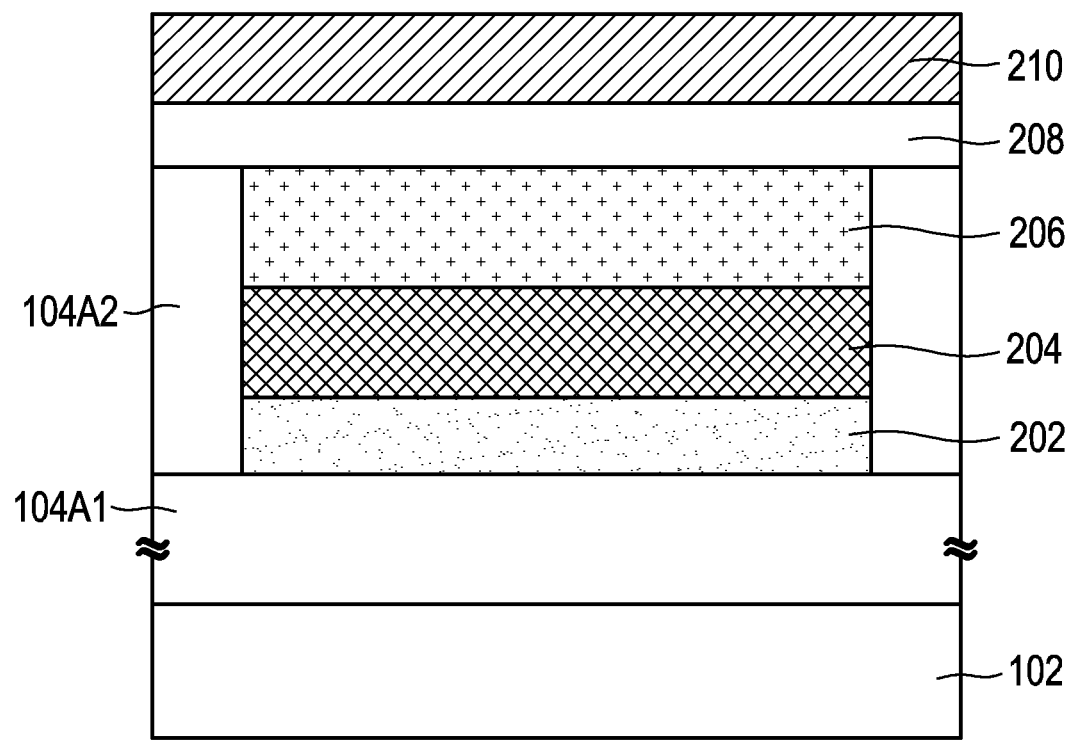

Referring to FIG. 2D, in a subsequent step, a gate dielectric 208 and a gate electrode 210 are sequentially formed over the channel layer 206, and on the dielectric layer 104A2. For example, the gate dielectric 208 is sandwiched between the channel layer 206 and the gate electrode 210. In some embodiments, the gate dielectric 208 is a high-k dielectric layer including materials such as hafnium oxide ($HfO_2$), zirconium oxide ($ZrO_2$), aluminum oxide ($Al_2O_3$), other high-k dielectric materials or the like. In some embodiments, high-k dielectric materials are generally dielectric materials having a dielectric constant higher than 4, greater than about 12, greater than about 16, or even greater than about 20. In some embodiments, the gate dielectric 208 is formed by PVD, CVD, ALD, or formed by a solution process, or the like.

As further illustrated in FIG. 2D, the gate electrode 210 is directly formed on a top surface of the gate dielectric 208. In some embodiments, the gate electrode 210 include conductive materials such as copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In certain embodiments, the gate electrode 210 also includes materials to fine-tune the corresponding work function. For example, the gate electrode 210 may include work function materials such as Pt, Ir, Pd, Ni, Au, Ru, Mo, Co, Cu, Cr, Fe, $In_2O_3$ or combinations thereof, or the like. In some embodiments, the conductive material of the gate electrode 210 is deposited through ALD, CVD, PVD, or the like.

Figure 2E:
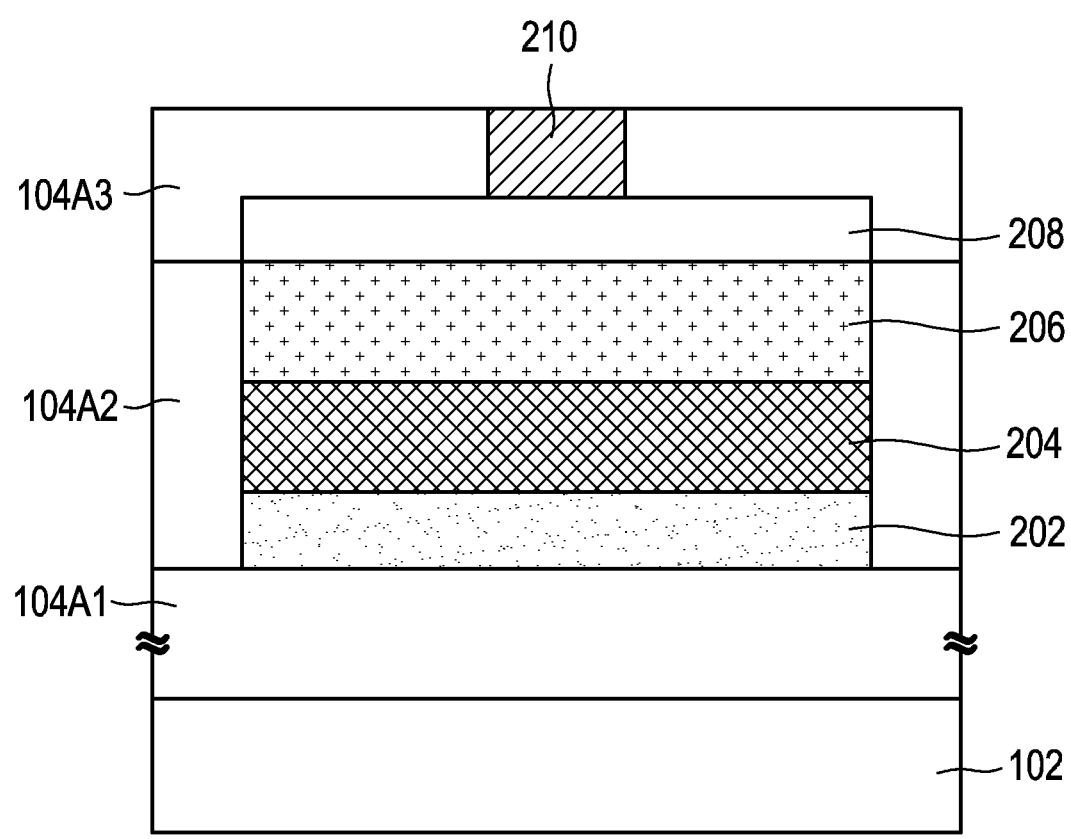

Referring to FIG. 2E, in a subsequent step, portions of the gate dielectric 208 and portions of the gate electrode 210 may be removed. For example, the gate dielectric 208 and the gate electrode 210 may be removed by photolithography processes. After the photolithography processes, sidewalls of the gate dielectric 208 may be aligned with the sidewalls of the channel layer 206, the magnesium oxide layer 204 and the bottom metal layer 202. In certain embodiments, the gate electrode 210 is patterned so that a lateral dimension of the gate electrode 210 is smaller than a lateral dimension of the gate dielectric 208. After patterning the gate dielectric 208 and the gate electrode 210, a dielectric layer 104A3 is formed to surround the gate dielectric 208 and the gate electrode 210. In some embodiments, the dielectric layer 104A3 may correspond to one of the dielectric layers 104A of the interconnection layer 104 shown in FIG. 1, thus its details will not be repeated herein. In some embodiments, the dielectric layer 104A3 is disposed on and contacting the dielectric layer 104A2. In some embodiments, after forming the dielectric layer 104A3, a planarization process (e.g., a CMP process) is performed to remove excessive dielectric material. After the planarization process, a top surface of the dielectric layer 104A3 may be aligned with a top surface of the gate electrode 210.

Figure 2F:
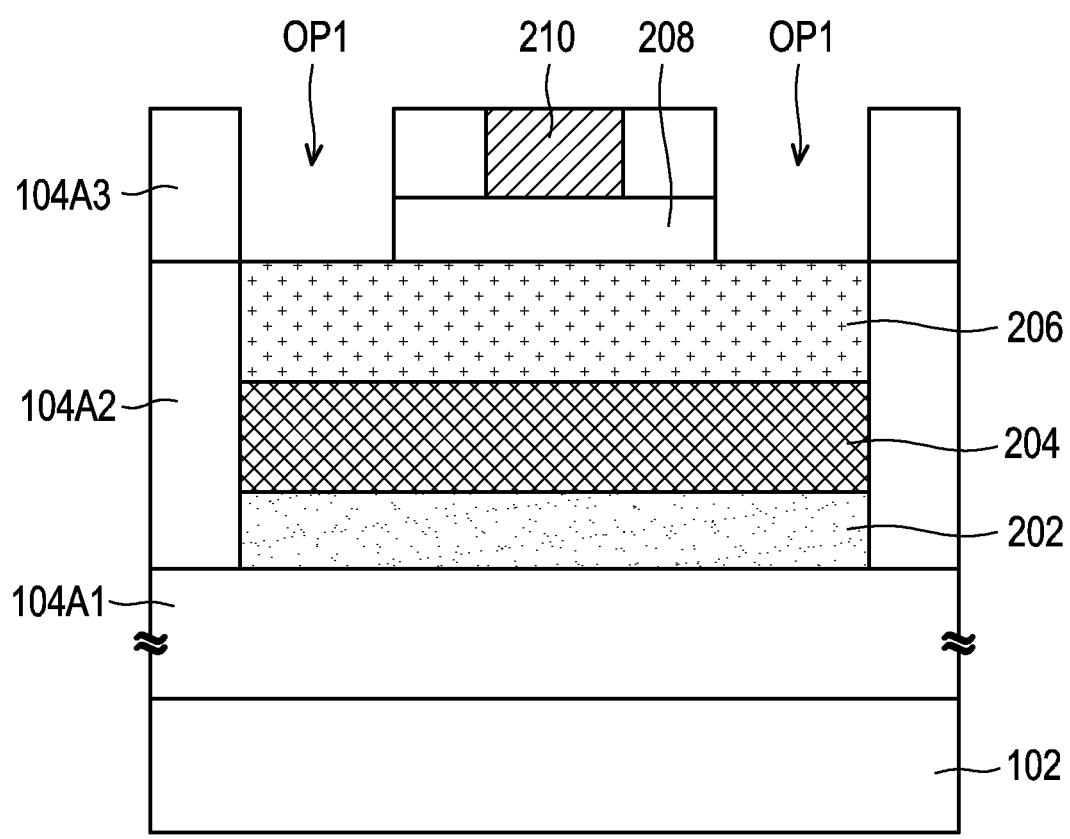
Figure 2G:
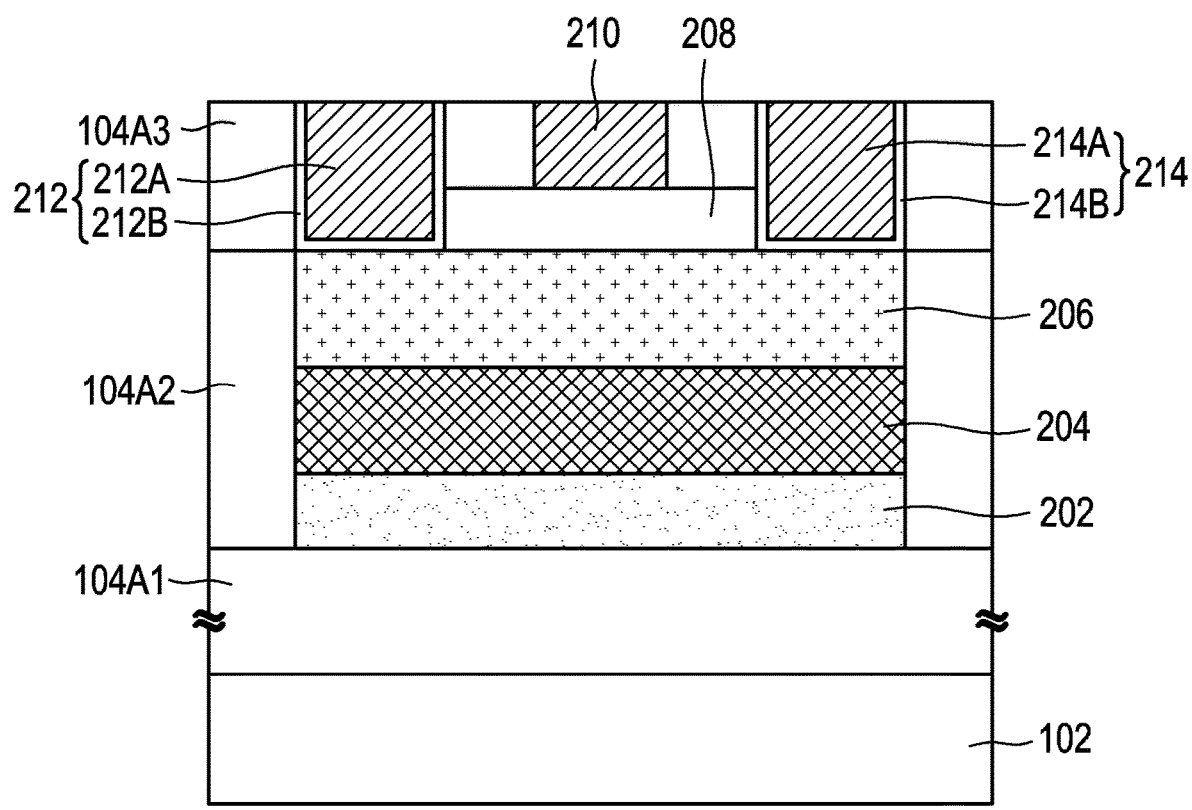

Referring to FIG. 2F, after forming the dielectric layer 104A3, the dielectric layer 104A3 is patterned to form openings OP1. For example, the openings OP1 reveal a top surface of the channel layer 206. Subsequently referring to FIG. 2G, a source electrode 212 and a drain electrode 214 are formed to fill up the openings OP1. For example, the gate dielectric 208 is located in between the source electrode 212 and the drain electrode 214, and contacting sidewalls of the source electrode 212 and sidewalls of the drain electrode 214. As illustrated in FIG. 2G, the source and drain electrodes 212, 214 respectively include body portions 212A, 214A and glue layers 212B, 214B surrounding the body portions 212A, 214A. For example, the body portions 212A, 214A may include conductive materials such as copper (Cu), aluminum (Al), tungsten (W), or the like. Furthermore, the glue layers 212B, 214B may include a conductive material such as a metal nitride, and the metal nitride may include titanium nitride (TiN), tantalum nitride (TaN), or the like. In some embodiments, the body portions 212A, 214A and the glue layers 212B, 214B may be formed by an acceptable deposition process such as CVD, PVD, ALD, PECVD, or the like. In addition, after forming the source and drain electrodes 212, 214, top surfaces of the source and drain electrodes 212, 214 are aligned with a top surface of the gate electrode 210 and a top surface of the dielectric layer 104A3.

Figure 2H:
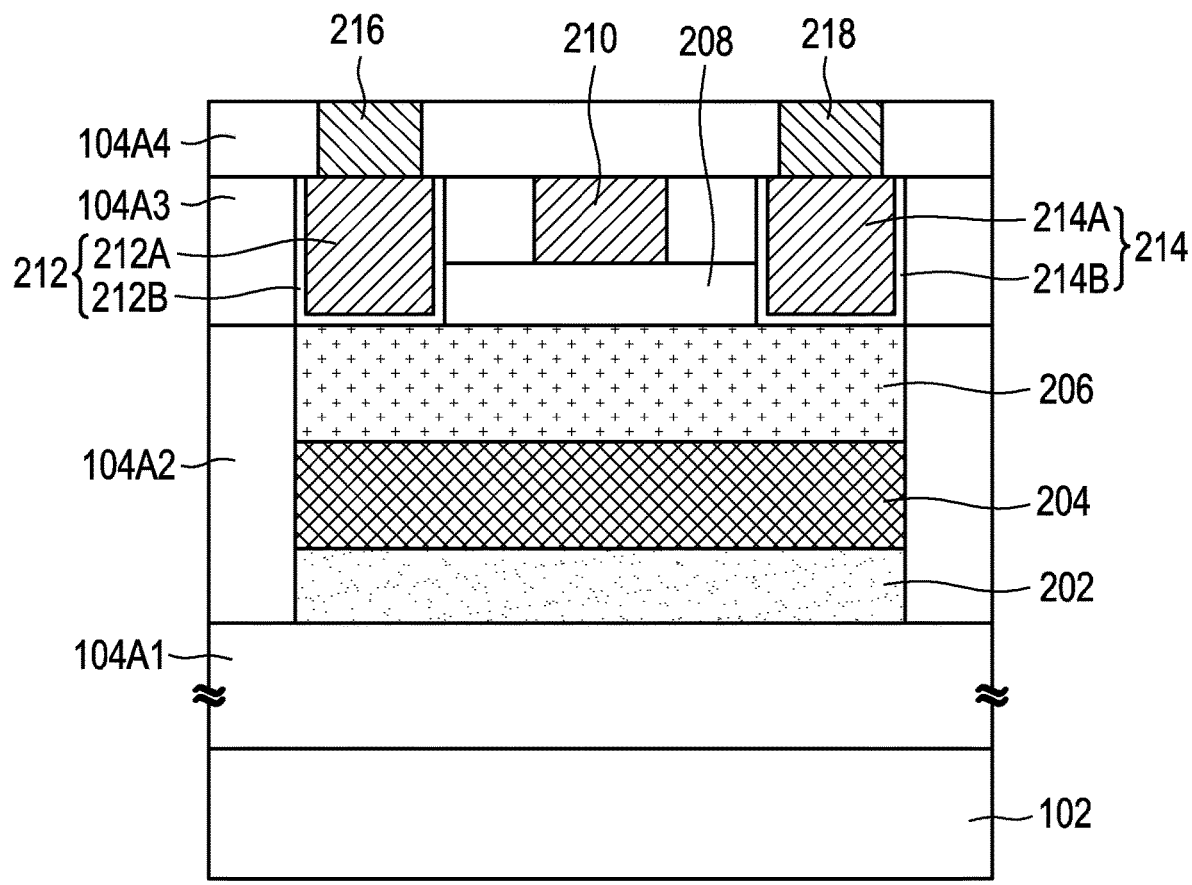

Referring to FIG. 2H, in a subsequent step, a dielectric layer 104A4 is formed over the dielectric layer 104A3. For example, the dielectric layer 104A4 may correspond to one of the dielectric layers 104A of the interconnection layer 104 shown in FIG. 1, thus its details will not be repeated herein. In some embodiments, the dielectric layer 104A4 is disposed on and contacting the dielectric layer 104A3. In some embodiments, the dielectric layer 104A4 may be patterned to form openings revealing the source and drain electrodes 212, 214. Thereafter, contact structures 216, 218 are formed in the openings, whereby the contact structure 216 is formed on and electrically connected to the source electrode 212, and the contact structure 218 is formed on and electrically connected to the drain electrode 218. The contact structures 216, 218 may correspond to any of the conductive vias 104B1 or conductive patterns 104B2 shown in FIG. 1, thus its details will be omitted herein. After forming the contact structures 216, 218, a transistor TR3-A located in the interconnection structure 104 of the semiconductor device 100 is accomplished. In the exemplary embodiment, by using the transistor TR3-A as a p-type transistor of the semiconductor device 100, the semiconductor device 100 may have improved stability and reliability.

Figure 3:
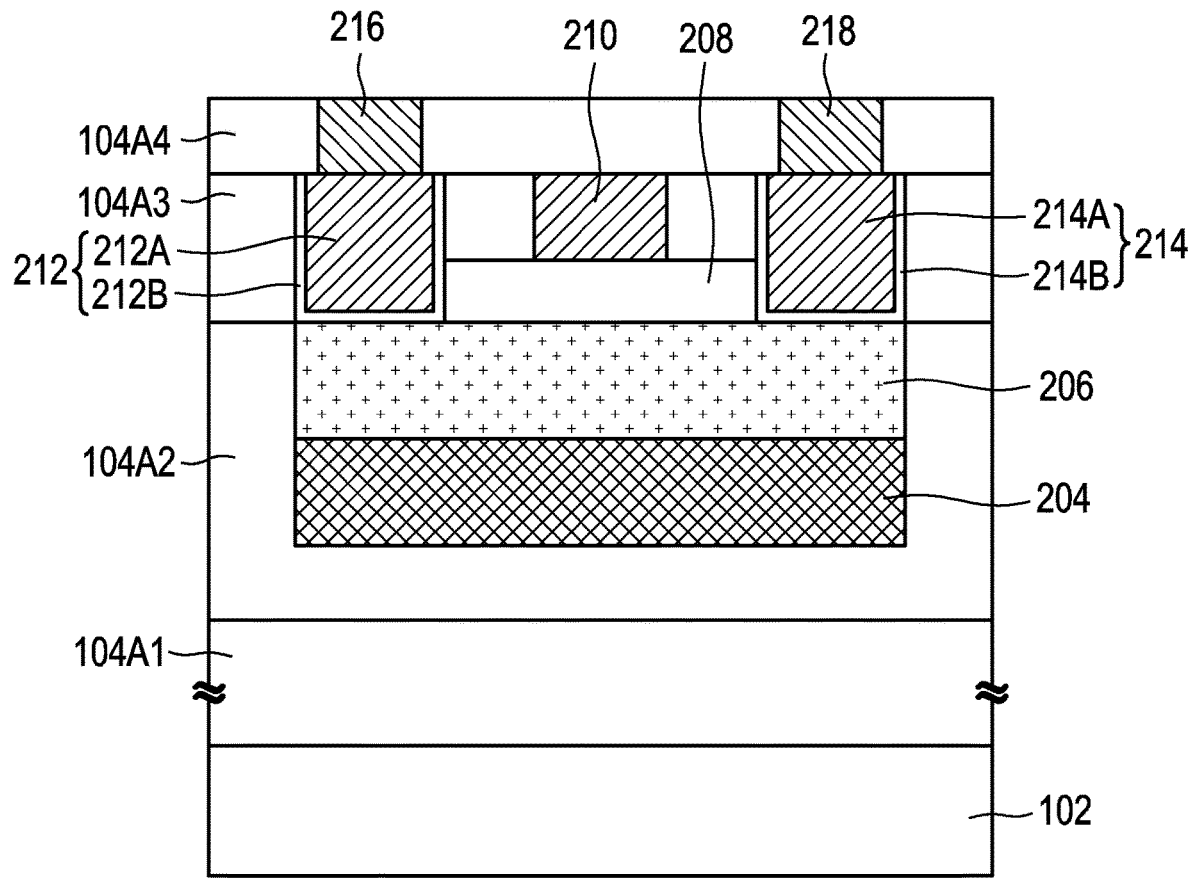
FIG. 3 is a schematic cross-sectional view of a transistor in accordance with some alternative embodiments of the present disclosure.

FIG. 3 is a schematic cross-sectional view of a transistor in accordance with some alternative embodiments of the present disclosure. The transistor TR3-B illustrated in FIG. 3 is similar to the transistor TR3-A illustrated in FIG. 2H. Therefore, the same reference numerals are used to refer to the same or liked parts, and its detailed description will be omitted herein. The difference between the embodiments is that the bottom metal layer 202 is omitted from the transistor TR3-B. In the transistor TR3-A of FIG. 2H, the bottom metal layer 202 is provided to improve the crystallinity of the magnesium oxide layer 204 formed thereon. However, in the transistor TR3-B illustrated in FIG. 3, the bottom metal layer 202 may be omitted, while the magnesium oxide layer 204 can still maintain an acceptable degree of crystallinity. In the exemplary embodiment, by using the transistor TR3-B as a p-type transistor of the semiconductor device 100, the semiconductor device 100 may have improved stability and reliability.

Figure 4:
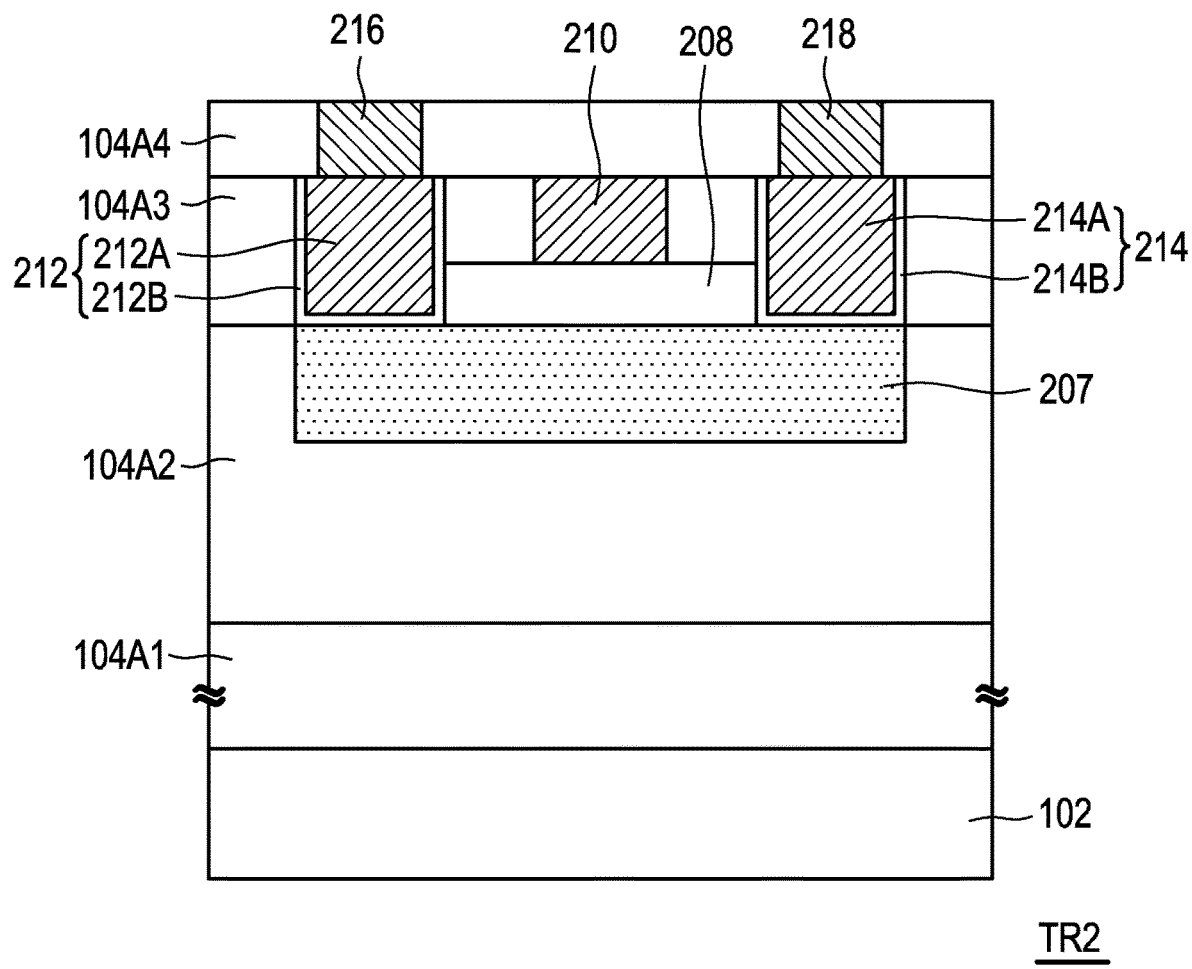
FIG. 4 is a schematic cross-sectional view of another transistor in accordance with some embodiments of the present disclosure.

FIG. 4 is a schematic cross-sectional view of another transistor in accordance with some embodiments of the present disclosure. The transistor TR2 illustrated in FIG. 4 is similar to the transistor TR3-A illustrated in FIG. 2H. Therefore, the same reference numerals are used to refer to the same or liked parts, and its detailed description will be omitted herein. The difference between the embodiments is that the transistor TR2 is a n-type transistor, while the transistor TR3-A is a p-type transistor. As illustrated in FIG. 4, in the transistor TR2, the bottom metal layer 202 and the magnesium oxide layer 204 are omitted. Furthermore, the channel layer 206 (the crystalline channel layer) of the transistor TR3-A (p-type transistor) is replaced with the channel layer 207. For example, the channel layer 207 is an amorphous channel layer, and may include materials such as indium-gallium-zinc-oxide (IGZO). In the exemplary embodiment, the transistor TR2 is used as n-type transistors, and the n-type transistors are included together with the p-type transistors described above in the semiconductor device 100 of FIG. 1. By using the transistor TR2 as the n-type transistor along with the p-type transistor in the semiconductor device 100, the semiconductor device 100 may have improved stability and reliability.

Figure 5:
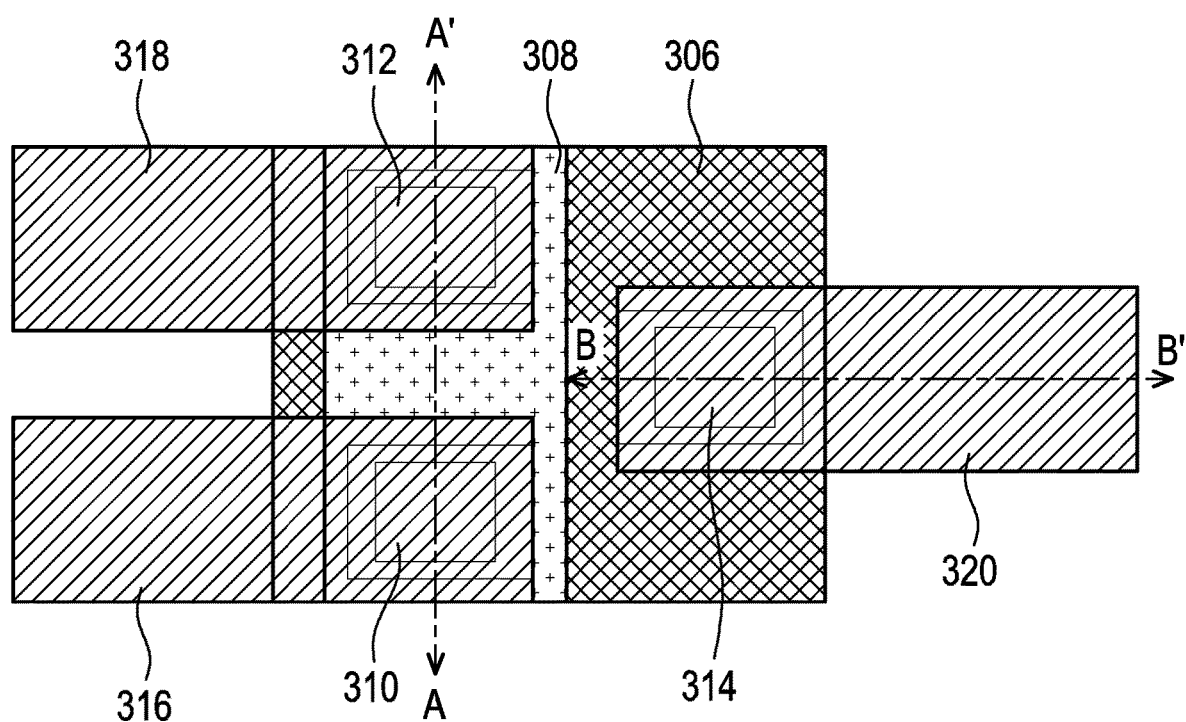
FIG. 5 is a top view of another transistor in accordance with some embodiments of the present disclosure.

FIG. 5 is a top view of another transistor in accordance with some embodiments of the present disclosure. FIG. 6A to FIG. 6F are schematic cross-sectional views illustrating various stages in a method of fabricating a transistor taken along the lines A-A' and B-B' shown in FIG. 5. In the previous embodiments, the transistor TR2, transistor TR3-A and transistor TR3-B are all top gate transistors. However, the disclosure is not limited thereto, and bottom gate transistors may be used as the p-type transistors and the n-type transistors.

As illustrated in the top view of the transistor shown in FIG. 5, the transistor includes source electrodes 310 and drain electrodes 312 located on the channel layer 308. The channel layer 308 is located over a magnesium oxide layer 306. In some embodiments, a gate contact 314 passes through the magnesium oxide layer 306 to be connected to a bottom gate electrode (not shown). In some embodiments, contact structures 316, 318 are respectively disposed on and connected to the source and drain electrodes 310, 312. Furthermore, a conductive line 320 is disposed on and connected to the gate contact 314. The details of forming such a bottom gate transistor will be referred to FIG. 6A to FIG. 6F.

Figure 6A:
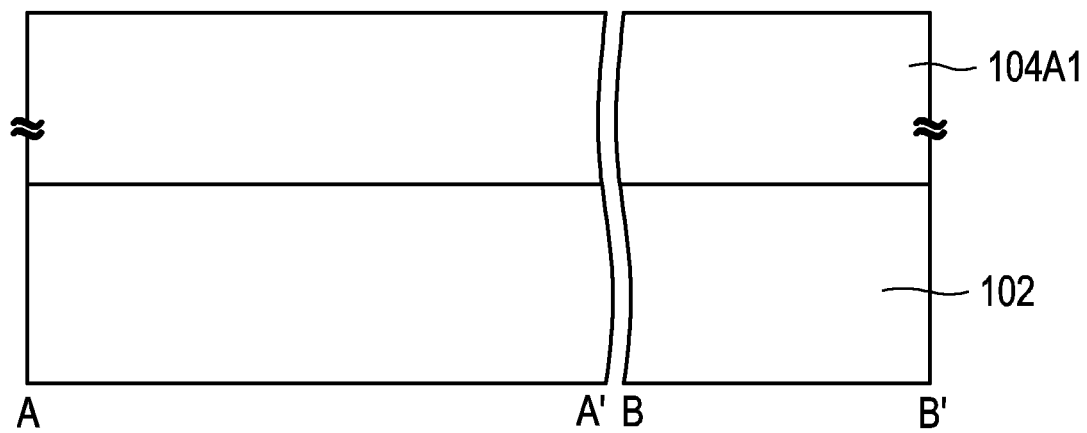
FIG. 6A to FIG. 6F are schematic cross-sectional views illustrating various stages in a method of fabricating the transistor taken along the lines A-A' and B-B' shown in FIG. 5.

As illustrated in FIG. 6A, a dielectric layer 104A1 is formed over the substrate 102 of the semiconductor structure 100. In some embodiments, the dielectric layer 104A1 may correspond to the dielectric layers 104A located at any level of the interconnection layer 104 shown in FIG. 1. In other words, the dielectric layer 104A1 may be directly contacting the substrate 102, or may be separated from the substrate 102 by a plurality of the dielectric layers 104A. In some embodiments, the dielectric layer 104A1 may be formed of the same material, and formed by the same method as with the dielectric layer 104A described above, thus its details will be omitted herein.

Figure 6B:
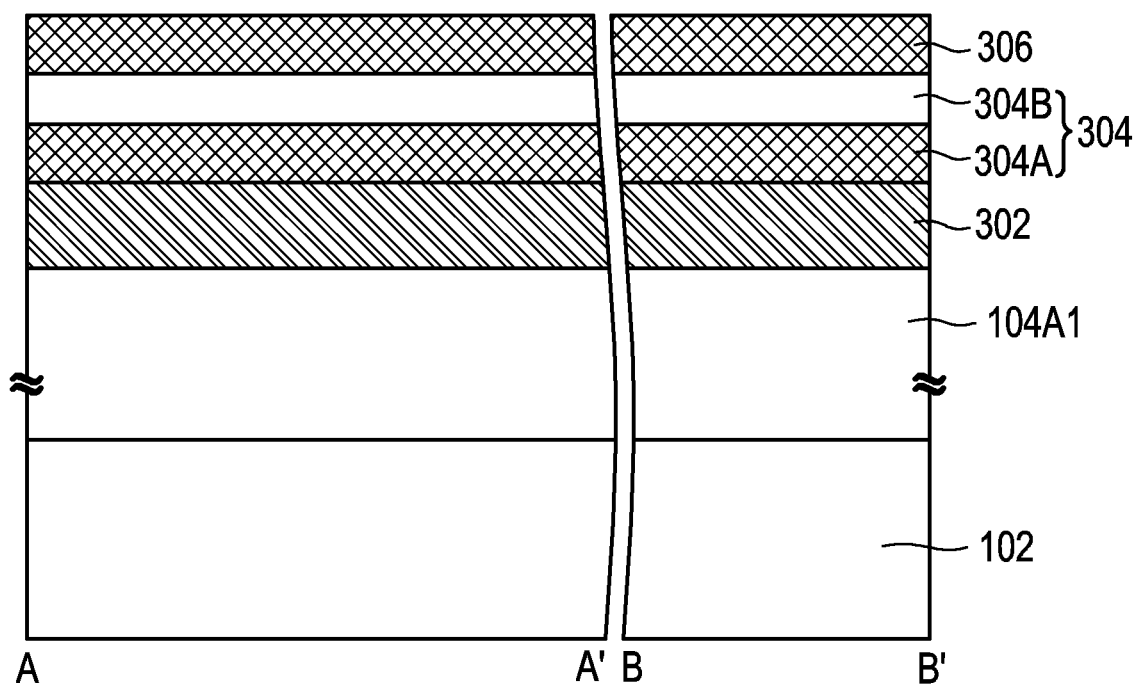

Referring to FIG. 6B, a gate electrode 302 is formed over the dielectric layer 104A1. For example, the gate electrode 302 is directly formed on a top surface of the dielectric layer 104A1. In some embodiments, the gate electrode 302 include conductive materials such as copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In certain embodiments, the gate electrode 302 also includes materials to fine-tune the corresponding work function. For example, the gate electrode 302 may include work function materials such as Pt, Ir, Pd, Ni, Au, Ru, Mo, Co, Cu, Cr, Fe, $In_2O_3$ or combinations thereof, or the like. In some embodiments, the conductive material of the gate electrode 302 is deposited through ALD, CVD, PVD, or the like.

After forming the gate electrode 302, a gate dielectric 304 and a magnesium oxide layer 306 are sequentially formed over the gate electrode 302. For example, in one embodiment, the gate dielectric 304 may include a first gate dielectric layer 304A disposed on the gate electrode 302, and a second gate dielectric layer 304B disposed on the first gate dielectric layer 304A. In one embodiment, the first gate dielectric layer 304A is a magnesium oxide (MgO) layer. In some other embodiments, the first gate dielectric layer 304A include other suitable gate dielectric materials such as metal oxides, metal nitrides, metal silicates, transition metal-oxides, transition metal-nitrides, transition metal-silicates, oxynitrides of metals, metal aluminates, or combinations thereof. Furthermore, in some embodiments, the second gate dielectric layer 304B is a high-k dielectric layer including materials such as hafnium oxide ($HfO_2$), zirconium oxide ($ZrO_2$), aluminum oxide ($Al_2O_3$), other high-k dielectric materials or the like. For example, high-k dielectric materials are generally dielectric materials having a dielectric constant higher than 4, greater than about 12, greater than about 16, or even greater than about 20. In some embodiments, the gate dielectric 304 is formed by PVD, CVD, ALD, or formed by a solution process, or the like. After forming the gate dielectric 304, a magnesium oxide layer 306 is formed over the gate dielectric 304. For example, the magnesium oxide layer 306 is formed by PVD, and has a crystal orientation of <100>.

Figure 6C:
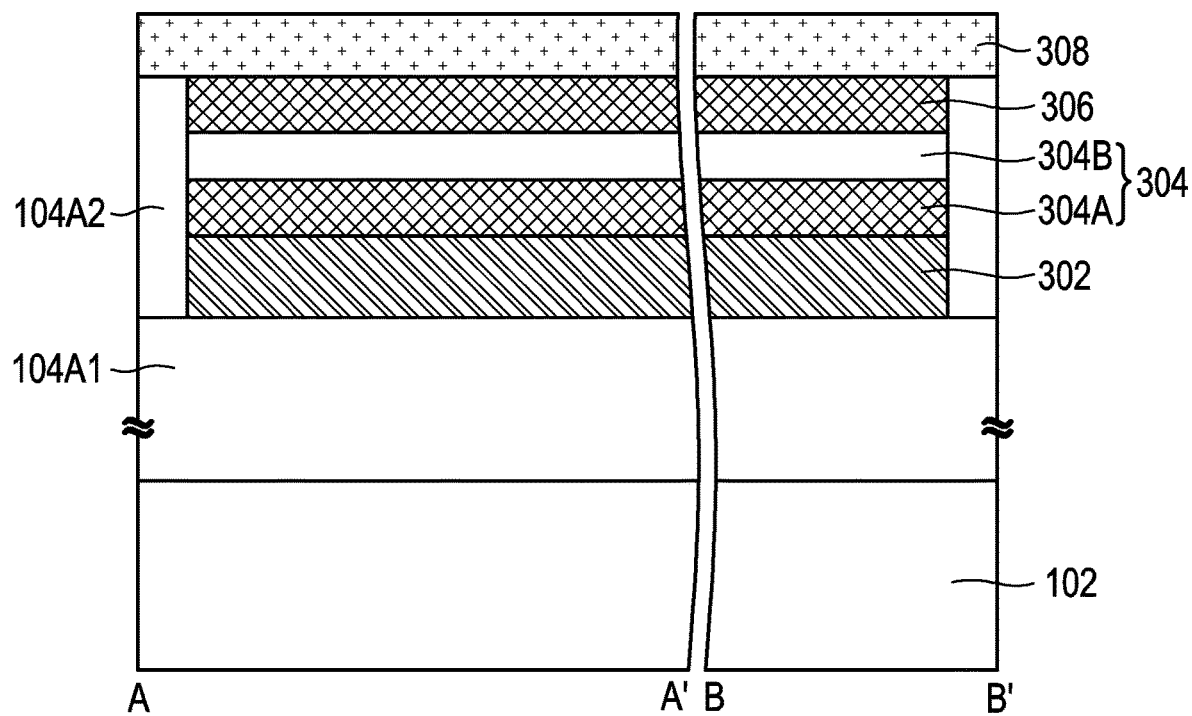

Referring to FIG. 6C, in a subsequent step, the gate electrode 302, the gate dielectric 304 and the magnesium oxide layer 306 may be patterned by photolithography processes. For example, after the patterning step, sidewalls of the gate electrode 302 are aligned with sidewalls of the gate dielectric 304 and sidewalls of the magnesium oxide layer 306. In some embodiments, a dielectric layer 104A2 is formed to surround and cover sidewalls of the gate electrode 302, the gate dielectric 304 and the magnesium oxide layer 306. In some embodiments, the dielectric layer 104A2 may correspond to one of the dielectric layers 104A of the interconnection layer 104 shown in FIG. 1, thus its details will not be repeated herein. In some embodiments, the dielectric layer 104A2 is disposed on and contacting the dielectric layer 104A1. In some embodiments, after forming the dielectric layer 104A2, a planarization process (e.g., a chemical-mechanical planarization (CMP) process) is performed to remove excessive dielectric material. After the planarization process, a top surface of the dielectric layer 104A2 may be aligned with a top surface of the magnesium oxide layer 306.

In some embodiments, a channel layer 308 is formed to be in direct contact with the magnesium oxide layer 306. In some embodiments, the channel layer 308 includes a material selected from the group consisting of germanium (Ge), nickel oxide (NiO), and tellurium (Te). In one exemplary embodiment, the channel layer 308 is a single crystal germanium (Ge) layer, and a crystal orientation of the channel layer 308 is <100>. Furthermore, the channel layer 308 may be formed by PVD, CVD, atomic layer deposition (ALD), or formed by a solution process, or the like.

Figure 6D:
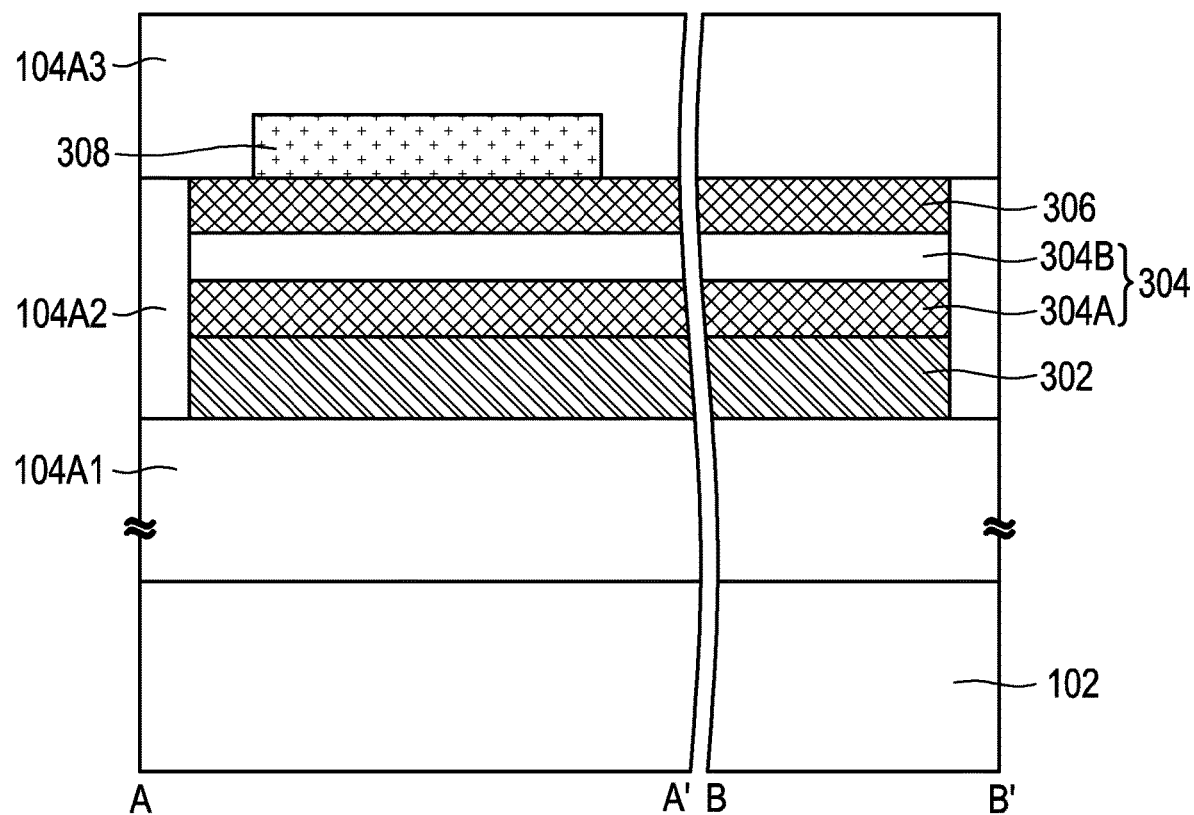

Referring to FIG. 6D, after forming the channel layer 308, the channel layer 308 is patterned so that a lateral dimension of the channel layer 308 is reduced. For example, the lateral dimension of the channel layer 308 is less than a lateral dimension of the magnesium oxide layer 306. In some embodiments, a dielectric layer 104A3 is formed to surround the channel layer 308. For example, the dielectric layer 104A3 may correspond to one of the dielectric layers 104A of the interconnection layer 104 shown in FIG. 1, thus its details will not be repeated herein. In some embodiments, the dielectric layer 104A3 is disposed on and contacting the dielectric layer 104A2.

Figure 6E:
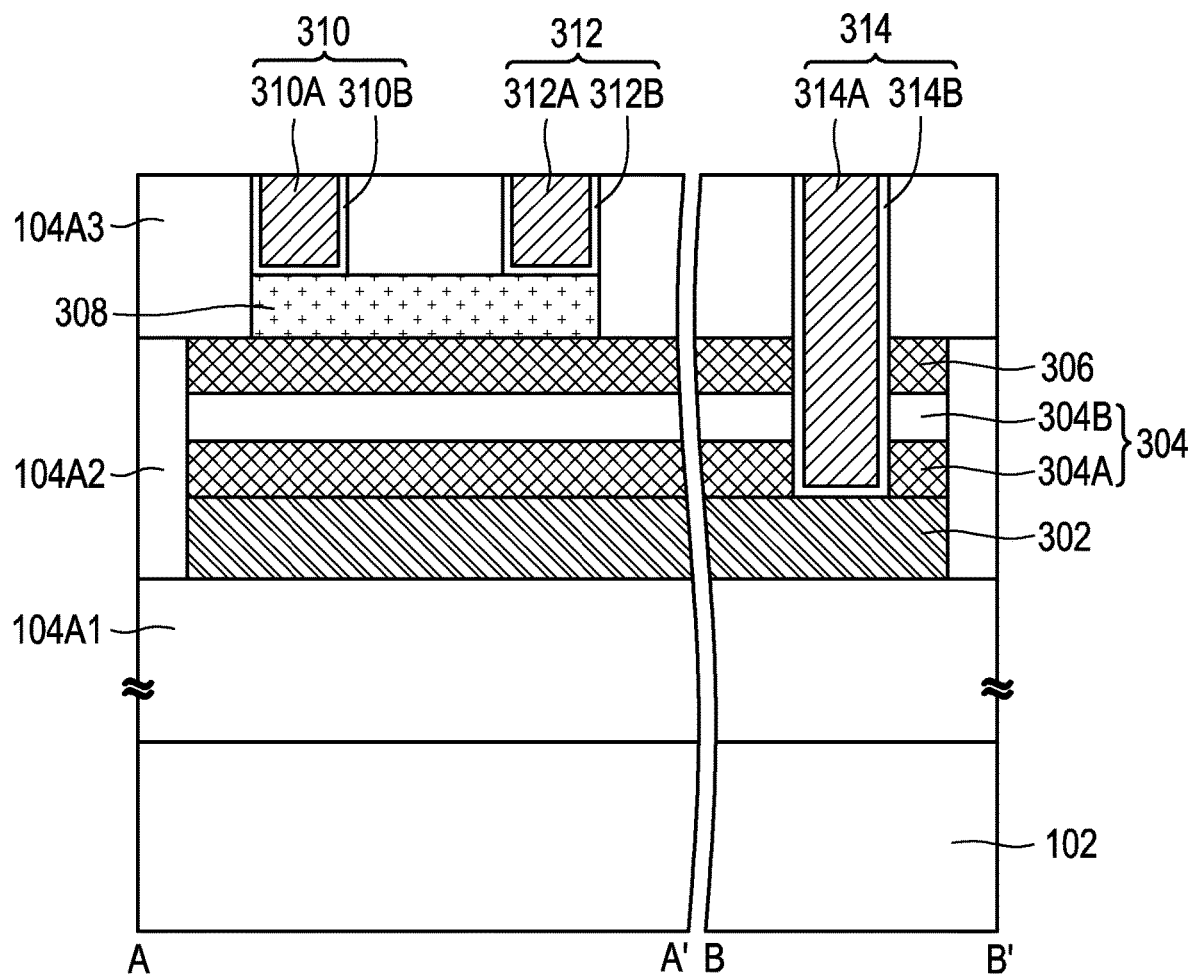

Referring to FIG. 6E, in a subsequent step, the dielectric layer 104A3 is patterned to form openings revealing the channel layer 308, and a source electrode 310 and a drain electrode 312 are formed in the openings over the channel layer 308. As illustrated in FIG. 6E, the source and drain electrodes 310, 312 respectively include body portions 310A, 312A and glue layers 310B, 312B surrounding the body portions 310A, 312A. For example, the body portions 310A, 312A may include conductive materials such as copper (Cu), aluminum (Al), tungsten (W), or the like. Furthermore, the glue layers 310B, 312B may include a conductive material such as a metal nitride, and the metal nitride may include titanium nitride (TiN), tantalum nitride (TaN), or the like. In some embodiments, the body portions 310A, 312A and the glue layers 310B, 312B may be formed by an acceptable deposition process such as CVD, PVD, ALD, PECVD, or the like.

In some embodiments, the dielectric layer 104A3 along with the magnesium oxide layer 306 and the gate dielectric 304 are patterned together to form an opening revealing a top surface of the gate electrode 302. Thereafter, a gate contact 314 is formed in the opening to be electrically connected to the gate electrode 302. In some embodiments, the gate contact 314 includes a body portion 314A and a glue layer 314B surrounding the body portion 314A. For example, a material of the body portion 314A and the glue layer 314B may be similar to a material of the body portions 310A, 312A and the glue layers 310B, 312B mentioned above, thus its details will be omitted herein. In some embodiments, a bottom surface of the gate contact 314 is in direct contact with the gate electrode 302, while sidewalls of the gate contact 314 are surrounded by the gate dielectric 304, the magnesium oxide layer 306, and the dielectric layer 104A3.

Figure 6F:
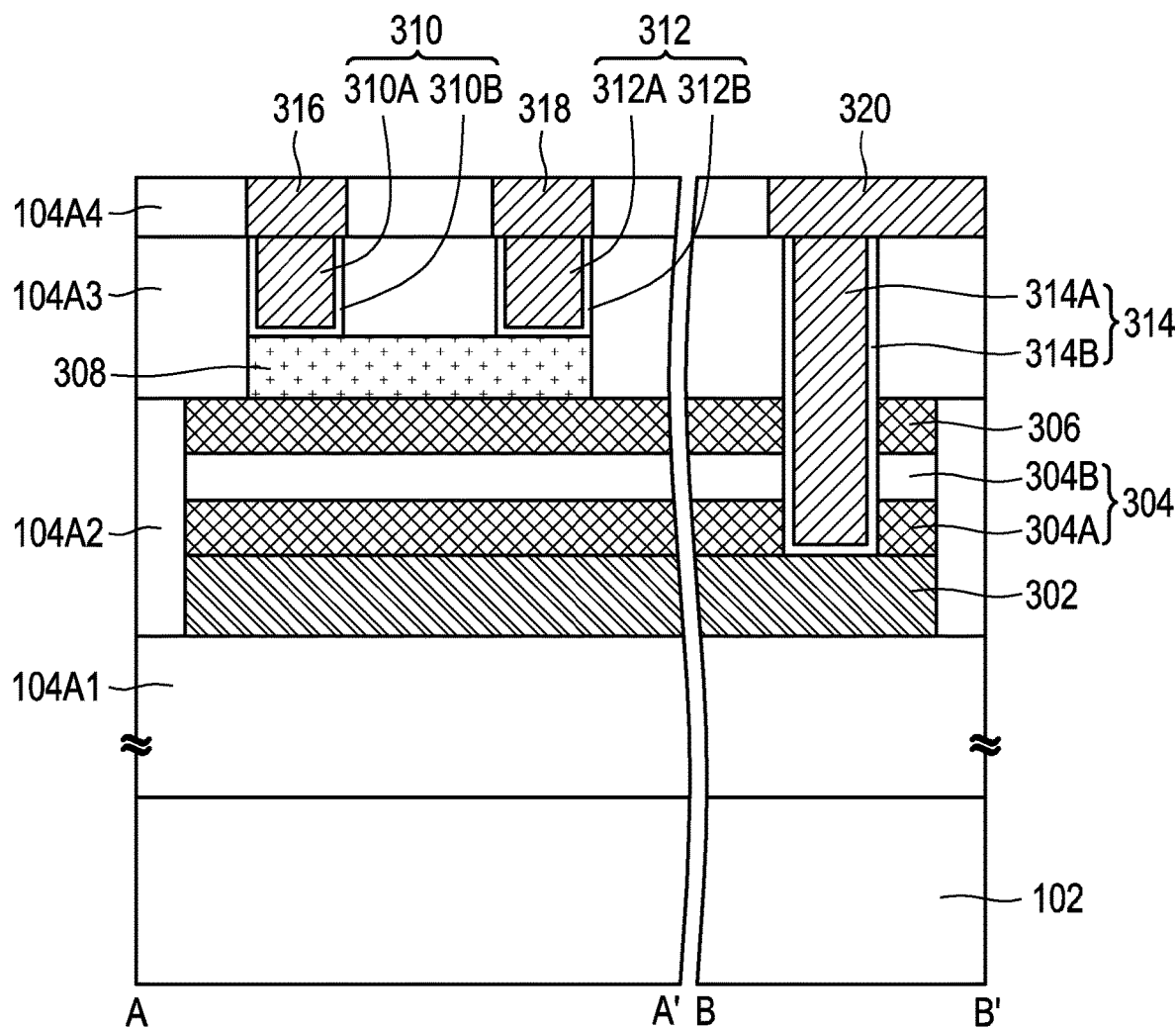

Referring to FIG. 6F, after forming the source and drain electrodes 310, 312 and the gate contact 314, a dielectric layer 104A4 is formed over the dielectric layer 104A3. For example, the dielectric layer 104A4 may correspond to one of the dielectric layers 104A of the interconnection layer 104 shown in FIG. 1, thus its details will not be repeated herein. In some embodiments, the dielectric layer 104A4 is disposed on and contacting the dielectric layer 104A3. In some embodiments, the dielectric layer 104A4 may be patterned to form openings revealing the source and drain electrodes 310, 312. Thereafter, contact structures 316, 318 are formed in the openings, whereby the contact structure 316 is formed on and electrically connected to the source electrode 310, and the contact structure 318 is formed on and electrically connected to the drain electrode 314. Similarly, the dielectric layer 104A4 is patterned to form an opening revealing the gate contact 314, and a conductive line 320 may be formed in the opening to be electrically connected to the gate contact 314. The contact structures 316, 318 and the conductive line 320 may correspond to any of the conductive vias 104B1 or the conductive patterns 104B2 shown in FIG. 1, thus its details will be omitted herein After forming the contact structures 316, 318 and the conductive line 320, a transistor TR3-C (bottom gate structure) located in the interconnection structure 104 of the semiconductor device 100 is accomplished. In the exemplary embodiment, by using the transistor TR3-C as a p-type transistor of the semiconductor device 100, the semiconductor device 100 may have improved stability and reliability.

Figure 7:
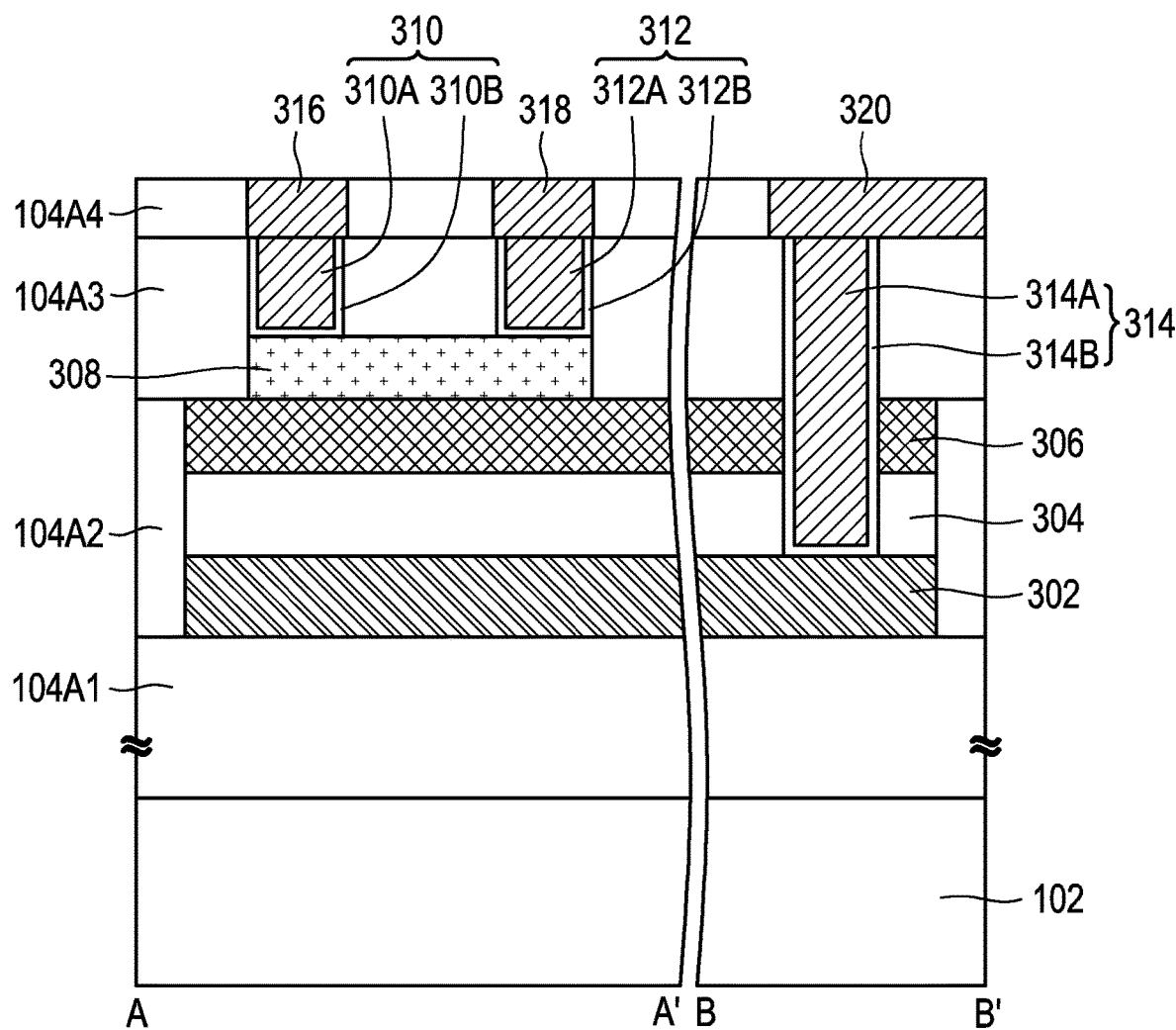
FIG. 7 is a schematic cross-sectional view of a transistor in accordance with some alternative embodiments of the present disclosure.

FIG. 7 is a schematic cross-sectional view of a transistor in accordance with some alternative embodiments of the present disclosure. The transistor TR3-D illustrated in FIG. 7 is similar to the transistor TR3-C illustrated in FIG. 6F. Therefore, the same reference numerals are used to refer to the same or like parts, and its detailed description will be omitted herein. The difference between the embodiments is that the gate dielectric 304 having a first gate dielectric layer 304A and a second gate dielectric layer 304B shown in FIG. 6F is replaced with a gate dielectric 305 having a single gate dielectric layer as shown in FIG. 7. In other words, the design of the gate dielectric 304 is not particularly limited and may include one or more layers, and if at least a magnesium oxide layer 306 is located below the channel layer 308, the magnesium oxide layer in the gate dielectric 304 may be omitted. In the exemplary embodiment, by using the transistor TR3-D as a p-type transistor of the semiconductor device 100, the semiconductor device 100 may have improved stability and reliability.

Figure 8:
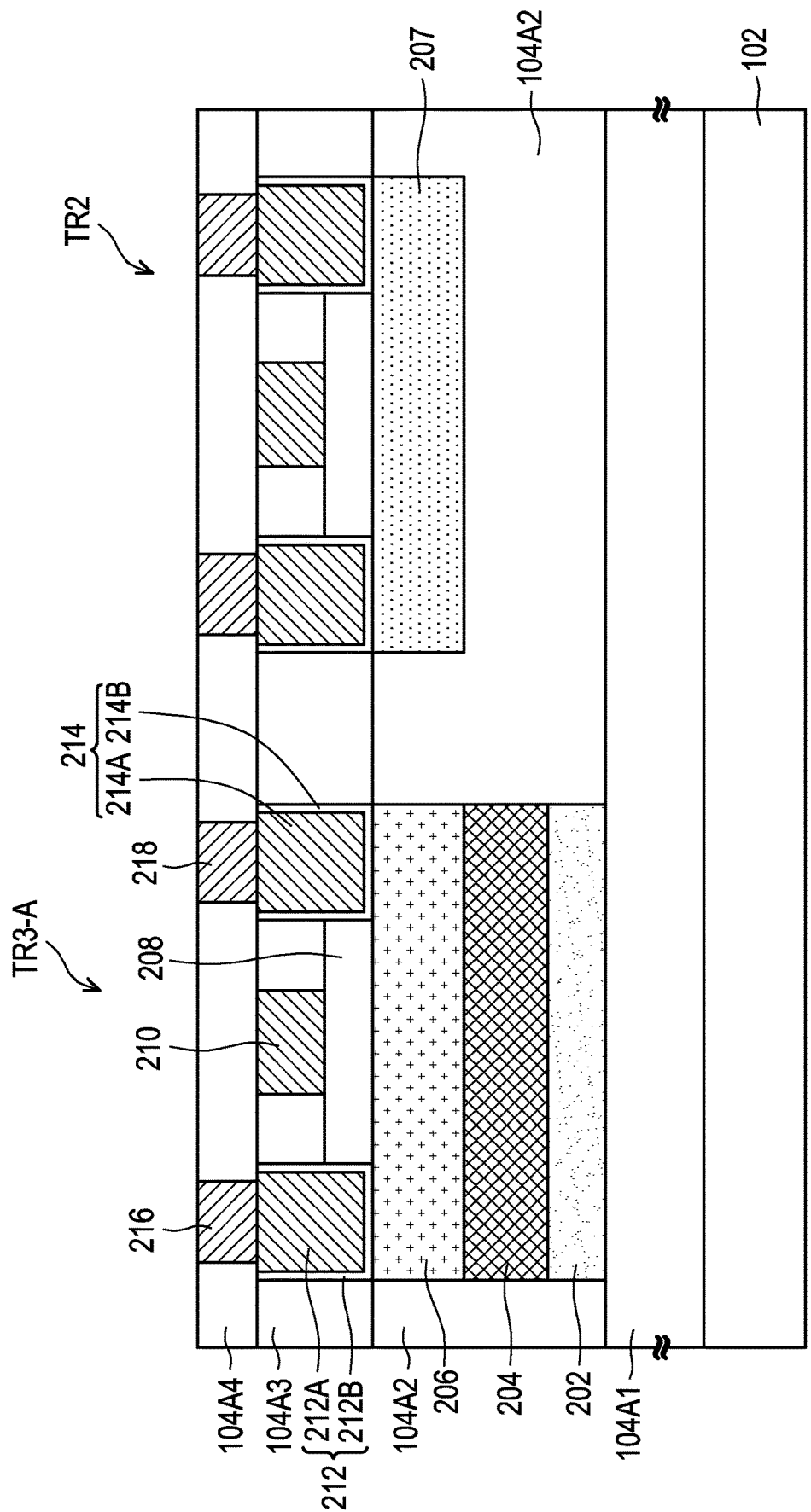
FIG. 8 is a schematic cross-sectional view of a portion of a transistor array in accordance with some embodiments of the present disclosure.

FIG. 8 is a schematic cross-sectional view of a portion of a transistor array in accordance with some embodiments of the present disclosure. In the above embodiment, only one transistor is illustrated in each layer of the interconnection structure 104 in the semiconductor device 100. However, the disclosure is not limited thereto. As illustrated in FIG. 8, at least a transistor TR3-A (first transistor) and a transistor TR2 (second transistor) are included in each layer of the interconnection structure 104 in the semiconductor device 100 shown in FIG. 1. In some embodiments, the transistor array includes a plurality of the transistors TR3-A illustrated in FIG. 2H and a plurality of the transistors TR2 illustrated in FIG. 4, in the semiconductor device 100. For example, the transistors TR3-A are p-type transistors while the transistors TR2 are n-type transistors. In some embodiments, the number of transistors TR2 (n-type transistors) located in the semiconductor device 100 is greater than the number of transistors TR3-A (p-type transistors) located in the semiconductor device 100.

As further illustrated in FIG. 8, when the transistors TR2 and the transistors TR3-A are located at the same level in the interconnection structure 104 of the semiconductor device 100, the source and drain electrodes 212, 214 and gate electrode 210 of the transistors TR2 may be substantially aligned with the source and drain electrodes 212, 214 and gate electrode 210 of the transistors TR3-A. Furthermore, the channel layer 206 of the transistors TR3-A may be substantially aligned with the channel layer 207 of the transistors TR2. In some embodiments, the magnesium oxide layer 204 and the bottom metal layer 202 of the transistors TR3-A are located at a level below the channel layer 207 of the transistors TR2. In the exemplary embodiment, by using the transistors TR2 as the n-type transistors along with the transistors TR3-A as the p-type transistors in the semiconductor device 100, the semiconductor device 100 may have improved stability and reliability.

Figure 9:
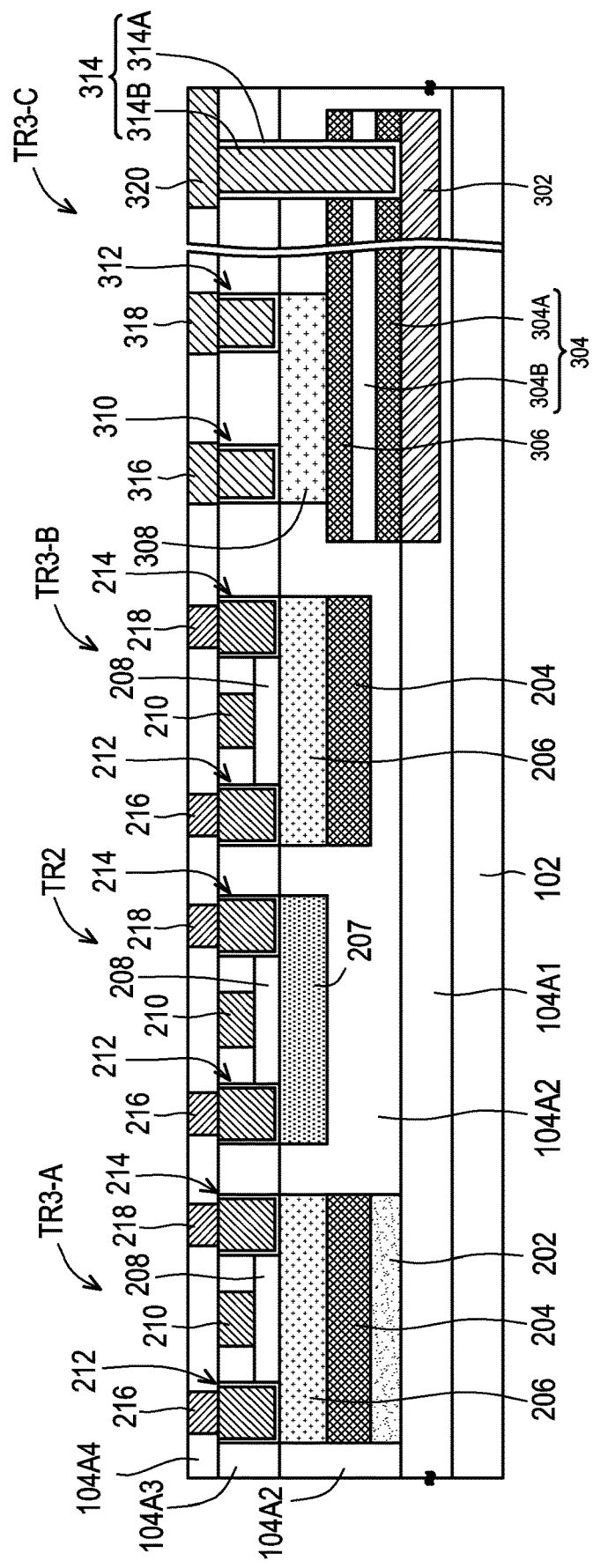
FIG. 9 is a schematic cross-sectional view of a portion of a transistor array in accordance with some other embodiments of the present disclosure.

FIG. 9 is a schematic cross-sectional view of a portion of a transistor array in accordance with some other embodiments of the present disclosure. The transistor array illustrated in FIG. 9 is similar to the transistor array illustrated in FIG. 8. Therefore, the same reference numerals may be used to refer to the same or liked parts, and its detailed description will be omitted herein. In the transistor array shown in FIG. 8, two types of transistors TR2, TR3-A are respectively used as n-type and p-type transistors in the semiconductor device 100. However, the disclosure is not limited thereto, and any of the transistors TR2, TR3-A, TR3-B, TR3-C, TR3-D may be included together in the semiconductor device 100.

For example, referring to FIG. 9, in some embodiments, the transistor array includes a plurality of the transistors TR3-A illustrated in FIG. 2H, a plurality of the transistors TR3-B illustrated in FIG. 3, a plurality of the transistors TR2 illustrated in FIG. 4, and a plurality of the transistors TR3-C illustrated in FIG. 6F, in the semiconductor device 100. For example, the transistors TR3-A, TR3-B, TR3-C are p-type transistors while the transistors TR2 are n-type transistors. The number of n-type transistors included in the semiconductor device 100 is greater than the number of different p-type transistors included in the semiconductor device 100. In the exemplary embodiment, if the above transistors are located at the same level in the interconnection structure 104 of the semiconductor device 100, the source and drain electrodes 212, 214 of the transistors TR3-A, TR2, TR3-B may be aligned with the source and drain electrodes 310, 312 of the transistors TR3-C. Furthermore, the magnesium oxide layers 204 of the transistors TR3-A, TR3-B and the magnesium oxide layer 306 of the transistors TR3-C are located at a level below the channel layer 207 of the transistors TR2. In the exemplary embodiment, by using the transistors TR2 as the n-type transistors along with the transistors TR3-A, TR3-B, TR3-C as the p-type transistors in the semiconductor device 100, the semiconductor device 100 may have improved stability and reliability.

In the above-mentioned embodiments, the semiconductor device includes at least a transistor having a channel layer with a crystal orientation of <100> or <110>, and a magnesium oxide layer located below the channel layer and in contact with the channel layer. As such, the above transistor may be used as an alternative p-type transistor in the semiconductor device, to provide improved stability and reliability of the semiconductor device.

In accordance with some embodiments of the present disclosure, a semiconductor device includes a substrate, and a first transistor disposed on the substrate. The first transistor includes a first channel layer, a magnesium oxide layer, a first gate electrode, a first gate dielectric and first source/drain electrodes. A crystal orientation of the first channel layer is <100> or <110>. The magnesium oxide layer is located below the first channel layer and in contact with the first channel layer. The first gate electrode is located over the first channel layer. The first gate dielectric is located in between the first channel layer and the first gate electrode. The first source/drain electrodes are disposed on the first channel layer.

In accordance with some other embodiments of the present disclosure, a semiconductor device includes a substrate, an interconnection structure disposed on the substrate and a plurality of conductive terminals disposed on and electrically connected to the interconnection structure. The interconnect structure includes a plurality of dielectric layers and a plurality of conductive layers alternately stacked. A plurality of p-type transistors is embedded in the plurality of dielectric layers, wherein the plurality of p-type transistors includes a crystalline channel layer, and a magnesium oxide layer located below the crystalline channel layer. A plurality of n-type transistors is embedded in the plurality of dielectric layers, wherein the plurality of n-type transistors includes an amorphous channel layer.

In accordance with yet another embodiment of the present disclosure, a method of forming a semiconductor device is described. The method includes forming a first transistor on a substrate, wherein the first transistor is formed by the following steps. A magnesium oxide layer is formed on the substrate. A first channel layer is formed on the substrate, wherein the magnesium oxide layer is located below the first channel layer and in contact with the first channel layer, and a crystal orientation of the first channel layer is <100> or <110>. A first gate electrode is formed over the first channel layer. A first gate dielectric is formed in between the first channel layer and the first gate electrode. First source/drain electrodes are formed on the first channel layer The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first transistor disposed on the substrate, wherein the first transistor comprises:
      a first channel layer, wherein a crystal orientation of the first channel layer is <100> or <110>;
      a magnesium oxide layer located below the first channel layer and in contact with the first channel layer;
      a first gate electrode located over the first channel layer;
      a first gate dielectric located in between the first channel layer and the first gate electrode; and
      first source/drain electrodes disposed on the first channel layer; and
   a second transistor disposed on the substrate, wherein the second transistor comprises:
      a second channel layer, wherein the second channel layer comprises indium-gallium-zinc-oxide (IGZO);
      second source/drain electrodes disposed on the second channel layer;
      a second gate electrode disposed on the second channel layer; and
      a second gate dielectric located in between the second channel layer and the second gate electrode.

2. The semiconductor device according to claim 1, wherein a crystal orientation of the magnesium oxide layer is the same as the crystal orientation of the first channel layer.

3. The semiconductor device according to claim 1, further comprising a bottom metal layer located below and in contact with the magnesium oxide layer.

4. The semiconductor device according to claim 3, wherein the bottom metal layer comprises a material selected from the group consisting of iron (Fe), cobalt-iron-boron (CoFeB) and nickel-chromium (NiCr).

5. The semiconductor device according to claim 1, wherein the first channel layer comprises a material selected from the group consisting of germanium (Ge), nickel oxide (NiO), and tellurium (Te).

6. The semiconductor device according to claim 5, wherein the first channel layer is germanium (Ge).

7. A semiconductor device, comprising:
   a substrate;
   an interconnection structure disposed on the substrate, wherein the interconnection structure comprises:
      a plurality of dielectric layers and a plurality of conductive layers alternately stacked;
      a plurality of p-type transistors embedded in the plurality of dielectric layers, wherein the plurality of p-type transistors comprises a crystalline channel layer, and a magnesium oxide layer located below the crystalline channel layer;
      a plurality of n-type transistors embedded in the plurality of dielectric layers, wherein the plurality of n-type transistors comprises an amorphous channel layer; and
   a plurality of conductive terminals disposed on and electrically connected to the interconnection structure.

8. The semiconductor device according to claim 7, wherein sidewalls of the crystalline channel layer are aligned with sidewalls of the magnesium oxide layer.

9. The semiconductor device according to claim 7, wherein the crystalline channel layer is a single crystal germanium (Ge) layer.

10. The semiconductor device according to claim 7, wherein the plurality of p-type transistors further comprises:
- first source/drain electrodes located on the crystalline channel layer;
- a first gate dielectric disposed on the crystalline channel layer and in between the first source/drain electrodes; and
- a first gate electrode disposed on the first gate dielectric.

11. The semiconductor device according to claim 7, wherein the plurality of p-type transistors further comprises:
- first source/drain electrodes located on the crystalline channel layer;
- a first gate dielectric disposed below the magnesium oxide layer; and
- a first gate electrode disposed below the first gate dielectric.

12. The semiconductor device according to claim 7, wherein the plurality of p-type transistors further comprise an iron (Fe) layer located below the magnesium oxide layer.

13. The semiconductor device according to claim 12, wherein a crystal orientation of the magnesium oxide layer is the same as a crystal orientation of the iron (Fe) layer and a crystal orientation of the crystalline channel layer.

14. The semiconductor device according to claim 7, wherein an amount of the plurality of n-type transistors located in the interconnection structure is greater than an amount of the plurality of p-type transistors located in the interconnection structure.

15. A method of forming a semiconductor device, comprising:
- forming a first transistor on a substrate, wherein the first transistor is formed by:
  - forming a magnesium oxide layer on the substrate;
  - forming a first channel layer on the substrate, wherein the magnesium oxide layer is located below the first channel layer and in contact with the first channel layer, and a crystal orientation of the first channel layer is <100> or <110>;
  - forming a first gate electrode over the first channel layer;
  - forming a first gate dielectric in between the first channel layer and the first gate electrode; and
  - forming first source/drain electrodes on the first channel layer; and
- forming a second transistor on the substrate, wherein the second transistor is formed by:
  - forming a second channel layer, wherein the second channel layer comprises indium-gallium-zinc-oxide (IGZO);
  - forming second source/drain electrodes disposed on the second channel layer;
  - forming a second gate electrode disposed on the second channel layer; and
  - forming a second gate dielectric in between the second channel layer and the second gate electrode.

16. The method according to claim 15, wherein the magnesium oxide layer is formed with a crystal orientation that is the same as the crystal orientation of the first channel layer.

17. The method according to claim 15, further comprising forming a bottom metal layer on the substrate prior to forming the magnesium oxide layer, and forming the magnesium oxide layer directly on the bottom metal layer.

18. The method according to claim 16, wherein the bottom metal layer comprises a material selected from the group consisting of iron (Fe), cobalt-iron-boron (CoFeB) and nickel-chromium (NiCr).

19. The method according to claim 15, wherein the first channel layer is formed as a single crystal germanium (Ge) layer.

20. The semiconductor device according to claim 1, wherein sidewalls of the first channel layer are aligned with sidewalls of the first source/drain electrodes.

* * * * *